US008842401B2

(12) United States Patent
Hill et al.

(10) Patent No.: US 8,842,401 B2
(45) Date of Patent: Sep. 23, 2014

(54) PROTECTION SYSTEM FOR AN ELECTRICAL POWER NETWORK

(75) Inventors: Jason E Hill, Newcastle-upon-Tyne (GB); Steven D A Fletcher, Glasgow (GB); Patrick J Norman, East Kilbride (GB); Stuart J Galloway, Edinburgh (GB)

(73) Assignee: Rolls-Royce PLC, London (GB)

( * ) Notice: Subject to any disclaimer, the term of this patent is extended or adjusted under 35 U.S.C. 154(b) by 118 days.

(21) Appl. No.: 13/359,010

(22) Filed: Jan. 26, 2012

(65) Prior Publication Data
US 2012/0200966 A1  Aug. 9, 2012

(30) Foreign Application Priority Data

Feb. 7, 2011  (GB) .................................. 1102031.0

(51) Int. Cl.
*H02H 3/00* (2006.01)
*G01R 31/02* (2006.01)
*H02H 3/44* (2006.01)
*H02H 7/26* (2006.01)

(52) U.S. Cl.
CPC ............. *H02H 3/445* (2013.01); *G01R 31/024* (2013.01); *H02H 7/268* (2013.01)
USPC ......................................................... 361/62

(58) Field of Classification Search
CPC ............. H02H 3/00; H02H 3/44; H02H 7/00; H02H 7/30; H02H 7/268; B60L 3/0069; B60L 3/04; B60L 3/12; G01R 31/02; G01R 31/024
USPC ........................................................... 361/62
See application file for complete search history.

(56) References Cited

U.S. PATENT DOCUMENTS

| 1,905,609 | A |   | 4/1933 | Stoecklin |
|-----------|---|---|--------|-----------|
| 3,671,809 | A |   | 6/1972 | Ryan et al. |
| 3,801,871 | A |   | 4/1974 | Loh |
| 4,352,137 | A |   | 9/1982 | Johns |
| 4,430,683 | A | * | 2/1984 | Kawai et al. ................... 361/42 |
| 4,577,254 | A | * | 3/1986 | Yamaura ........................ 361/80 |
| 5,513,061 | A |   | 4/1996 | Gelbien et al. |

(Continued)

FOREIGN PATENT DOCUMENTS

DE  10 2006 019 467 A1  10/2007
EP       0 139 123 A1   5/1985

(Continued)

OTHER PUBLICATIONS

Siemens AG, Electrical network's short-circuit detecting method for use in e.g. industry, DE102006019467 (english translation), Oct. 2007.*

(Continued)

*Primary Examiner* — Jared Fureman
*Assistant Examiner* — Kevin J Comber
(74) *Attorney, Agent, or Firm* — Oliff PLC

(57) ABSTRACT

A protection system is provided for an electrical power network. The system has one or more circuit breaker arrangements which on activation isolate electrical faults within the network, and one or more fault detectors. The or each fault detector measures an inductance of a respective section of the network. The system is configured to activate one or more of the circuit breaker arrangements in response to measured inductances which are indicative of a fault.

9 Claims, 3 Drawing Sheets

(56) References Cited

U.S. PATENT DOCUMENTS

| | | |
|---|---|---|
| 7,366,622 B1 | 4/2008 | Nemir et al. |
| 2007/0262780 A1 | 11/2007 | Mernyk et al. |
| 2010/0309696 A1* | 12/2010 | Guillot et al. ............... 363/124 |
| 2011/0043214 A1* | 2/2011 | Potter et al. ................. 324/525 |

FOREIGN PATENT DOCUMENTS

| | | |
|---|---|---|
| EP | 0 219 790 A1 | 4/1987 |
| EP | 2 287 989 A1 | 2/2011 |
| GB | 2 348 554 A | 10/2000 |

OTHER PUBLICATIONS

Search Report issued in European Patent Application No. 12 15 2599 dated Jun. 18, 2012.

British Search Report issued in British Application No. GB1102031.0 dated Jul. 20, 2011.

* cited by examiner

PROTECTION SYSTEM FOR AN ELECTRICAL POWER NETWORK

The present invention relates to a protection system for an electrical power network.

It is important to protect electrical power networks from faults, such as short circuits, in order to safeguard users and to prevent or reduce damage to components of the network. One approach to network protection is known as non-unit protection. This approach looks at the network from a single point to detect a fault on a line. There are a number of known technologies which perform non-unit protection, three of which are discussed below.

Overcurrent protection is commonly implemented in compact DC systems, such as marine and aerospace electrical networks, and operates on the principle that when a fault occurs on a network, the resulting current is usually significantly higher than that experienced under normal operating conditions. This allows an upper current threshold to be set (above the normal operating current) and when the current rises above this threshold, it indicates that there is a fault on the system. The fault current can be of a varying magnitude depending on the location of the fault, which can lead to different fault levels at different parts of the network. FIG. 1 shows circuit breaker relays 1 at different distances from a generator 2 along a radial current distribution line 3. The upper current thresholds at different parts of the network are indicated. A main aim of any protection scheme is to locate and isolate faults with minimum disruption to the rest of the network, and this can be achieved here by co-ordinating the relay settings, so only the relay closest to the fault will operate. To provide backup, upstream relays may also operate after a time delay for downstream faults beyond other relays.

In many implementations, overcurrent protection is implemented using overcurrent relays with an inverse time-current characteristic. Thus if the current reaches a certain range a relay will operate the circuit breaker after a time depending on the value of the current; the higher the current, the shorter the operating time. The circuit breaker can also be set to operate instantaneously if the current exceeds a certain value. These values can be manually adjusted, either changing the delay times or changing the current thresholds.

Another technology, commonly used in DC traction applications, is rate of current rise (ROCR) fault protection.

ROCR fault protection operates on the principle that under fault conditions current will rise more rapidly than under normal operating conditions. The approach is quite similar to overcurrent protection, but a significant advantage is that faults can be detected earlier as the fault is detected while current is rising rather than at its peak. Thus the full fault current does not need to develop to allow detection and discrimination. Early fault detection and isolation is generally advantageous as it can help minimise disruption to the rest of the network and to reduce stress on circuit breaking equipment. FIG. 2 illustrates various levels of ROCR which a network may experience.

There are two distinct regions where load transients and fault transients would normally lie in terms of ROCR. However there is also a region of overlap where distinguishing between large load transients and high resistance faults becomes difficult. Partly for this reason ROCR is not usually used in isolation, and is normally accompanied by a current magnitude measurement to avoid spurious tripping.

The third technology is distance protection. This is commonly employed on long lengths of line (such as transmission lines). However, it is not as common in compact systems as the desired levels of discrimination are difficult to achieve.

Distance protection operates on the principle that the impedance of a transmission line is proportional to the length of the line, and so by measuring the impedance, the length of a line can be derived. Distance protection is implemented by measuring voltage and current at a point on the network and from that the impedance of the line downstream of that point can be calculated. If a fault occurs on the network it effectively shortens the length of the line from the point of measurement to the point of fault and so will change the measured impedance. The impedance characteristic is illustrated in FIG. 3 which shows three overlapping zones of protection covered by a relay physically located at the crossing between the X and R axis. Due to the uncertainties in both measurement and line parameters, which make it difficult to protect an exact length of line, the overlapping zones are used so that each part of the line can be protected. Faults in Zone 1 operate protection instantaneously, and in Zones 2 and 3 with respectively increasing time delays.

In physically compact power systems with short lengths of cable, such as those found in aerospace and marine applications, the impedances separating the load and generation systems are typically very small. This creates two fundamental problems for fault detection and isolation.

The first of these is that, due to the limited impedance of the line, if a fault has any resistance of its own (such is the case with arc faults) it can be difficult to discriminate between faults at different locations. This is because the fault resistance may dominate the overall fault path impedance, and hence the fault response. This can result in the system response being very similar for faults at different locations, making detection and discrimination challenging. Also, given that this resistance is an unknown variable, it can be difficult to set protection to operate for all range of faults that may be experienced.

Each of the three known technologies discussed above are sensitive to fault resistance in varying degrees. In respect of overcurrent protection, a high fault resistance suppresses the fault current and so overcurrent detection becomes less effective. In most cases, fault resistance is likely to be lower than load resistance, allowing faults to be detected (as fault currents will still be higher than the load current), but speed of operation will be reduced such that a fault can remain on the network for longer. Similarly to overcurrent protection, average ROCR over a period of time will be suppressed by any fault resistance, making the difference between faulted operation and normal operation less distinct. Thus, under ROCR fault protection, faults may not being detected or reduced speeds of operation may result. Under distance protection, in compact networks the impedance measurement can be easily offset by the fault resistance given the difference between cable impedance and fault resistance. This effectively rules out distance protection as a viable solution in such networks.

A second issue to consider is that electrical faults in physically compact networks are likely to develop very rapidly, in comparison to larger systems, and can be very severe in nature if high fault level sources (such as capacitors) are present. This fast fault development poses a significant challenge in terms of isolating of the fault in sufficient time in order to limit damage to equipment as well as minimising the risk to personnel. In addition, fast fault development can cause coordination issues between network protection and internal converter protection on the network. Therefore, within compact networks, fast acting protection (which implies rapid fault detection) is desirable, but can be problematic to achieve.

Rapid fault detection and discrimination can be difficult to achieve with conventional non-unit protection approaches for a number of reasons, including:

The high fault current from capacitors can cause instantaneous tripping of circuit breakers.

For resistive faults, fault levels generally do not change much when moving away from the source of the fault.

Capacitive discharge currents can cause partial circuit breaker operation, where the breaker begins to operate on the high current but when that dissipates the fault is not fully cleared.

Graded overcurrent protection can take a relatively long time to achieve proper discrimination, which can present problems in the coordination of converter internal protection and network protection.

A further issue is the size of the contactor/circuit breaking equipment required to break fault currents, especially in DC systems where circuit breakers are significantly larger than for the equivalently current rated AC devices. This is particularly a problem for compact systems where space and weight are major constraints on electrical system design. For example, if such a system utilises overcurrent protection, then the peak fault currents required to be interrupted can be very high and so require large circuit breaking equipment to isolate the fault. A more desirable solution would be to isolate the fault before the full fault current develops, allowing the circuit breaker ratings (including size and weight) to be lowered accordingly.

An aim of the present invention is to provide a protection system for an electrical power network that addresses the issues discussed above.

Accordingly, a first aspect of the present invention provides a protection system for an electrical power network, the system having:
one or more circuit breaker arrangements which on activation isolate electrical faults within the network, and
one or more fault detectors;
wherein the or each fault detector measures an inductance of a respective section of the network, the system being configured to activate one or more of the circuit breaker arrangements in response to measured inductances which are indicative of a fault.

Advantageously, by basing fault protection on inductance measurement, the system enables rapid fault detection and isolation. The system can be particularly useful when applied to the protection of compact networks.

The protection system may have any one or, to the extent that they are compatible, any combination of the following optional features.

The or each fault detector can measure the inductance of a respective section of the network containing a corresponding circuit breaker arrangement. This circuit breaker arrangement can then be configured to activate when the measured inductance falls beneath a predetermined inductance which is indicative of a fault in the section. In this way, the system can implement a distributed and autonomous form of protection. Conveniently, the predetermined inductance for the section can be the inductance for that section in the absence of a fault.

Alternatively, the system may have:
a plurality of the circuit breaker arrangements,
a plurality of the fault detectors, and
a control unit which operatively connects the fault detectors to the circuit breaker arrangements;
wherein:
the fault detectors measure the inductances of respective sections of the network, and
the control unit is configured to receive the measured inductances from the fault detectors, to determine therefrom the likely location of an electrical fault, and to send an activation signal to one or more of the circuit breaker arrangements to isolate the fault.

Thus rather than distributed and autonomous protection, such a system can provide a more sophisticated form of protection. Advantageously, the use of a plurality of measured inductances to determine the likely location of an electrical fault allows faults which are located on parts of the network more distal from the fault detectors to be detected and isolated. For example, such faults may be busbar faults.

Preferably, the or each fault detector includes:
a capacitance on the respective section of the network, and
a sensor for measuring the voltage drop, $V_{CF}$, across the capacitance and the rate of change of current, di/dt, at the capacitance output;
the inductance of the respective section being determined from $V_{CF}/(di/dt)$.

The protection system may further have a fault type identification arrangement which receives from the fault detectors the measured rates of change of current, di/dt, determines therefrom the second derivatives of current, $d^2i/dt^2$, across the capacitances, and identifies fault types from the second derivatives. The second derivative of current is generally proportional to fault resistance, which in turn can be characteristic of the fault type.

A second aspect of the invention provides an electrical power network having the protection system according to the first aspect. For example, the network can be a non land-based, (e.g. marine or aerospace) network. Typically, the network is a DC network, although applications to AC networks are not excluded.

The or each respective section of the network can interface to a corresponding power electronic converter for connection of a power supply or load to the network, the respective fault detector for the section conveniently measuring the inductance from a position at the interface of the converter with the section. Such a position is usually convenient due to the output capacitance at the converter interface. However, separate capacitances can also be provided in the network for inductance measurement at other positions, e.g. on network sections without power electronic converters.

A third aspect of the invention provides a method of protecting an electrical power network, the method including the steps of:
providing one or more circuit breaker arrangements which on activation isolate electrical faults within the network
measuring inductances of one or more respective sections of the network, and
activating one or more of the circuit breaker arrangements in response to measured inductances which are indicative of a fault.

Thus the method can be performed using the system of the first aspect. Optional features of the system thus provide corresponding optional features of the method.

For example, in the measuring step, the or each respective section of the network may contain a corresponding circuit breaker arrangement, and in the activating step, a corresponding circuit breaker arrangement may be activated when the measured inductance for the respective section falls beneath a predetermined inductance which is indicative of a fault in the section. In this way, the method can implement distributed and autonomous fault protection. The predetermined inductance for the section can conveniently be the inductance for that section in the absence of a fault.

Preferably, in the measuring step, the inductance of the or each respective section is determined from $V_{CF}/(di/dt)$, where $V_{CF}$ is the voltage drop measured across a capacitance on the section, and di/dt is the rate of change of current measured at the capacitance output. However, the method may include the further steps of: determining from the measured rates of change of current, di/dt, the second derivatives of current, $d^2i/dt^2$, at the capacitance outputs; and identifying fault types from the second derivatives.

Embodiments of the invention will now be described by way of example with reference to the accompanying drawings in which.

The protection system of the present invention is suitable for DC distribution networks where e.g. generators, energy storage devices and loads (both AC and DC) are interfaced through power electronic converters to the network.

Typically such a converter has a capacitance on the DC side. The protection system can monitor the initial rate of change of current discharge from the capacitance after the occurrence of a fault and use this to determine the fault location. This information can be used by the system to ensure coordinated operation of circuit breakers.

When a fault occurs on the DC network, each capacitor at a converter output begins to discharge and contribute to the fault. The initial rate of change of current at which these sources discharge is dependent on the initial voltage between the capacitance and the fault and the fault path inductance. When this initial rate of change is measured within an appropriate time frame, then fault location can be estimated through the calculation of line inductance.

Figure 1:
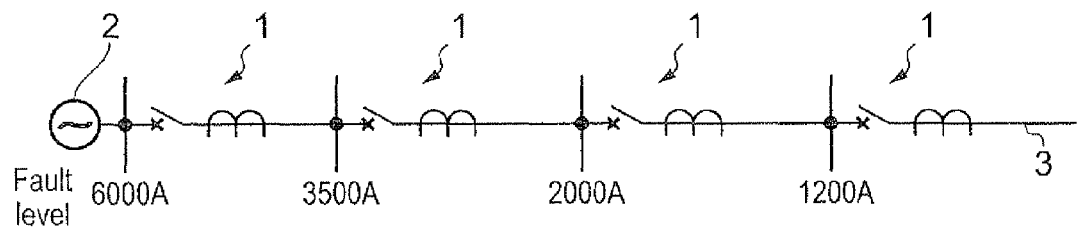
FIG. 1 shows a radial current distribution line.
Figure 2:
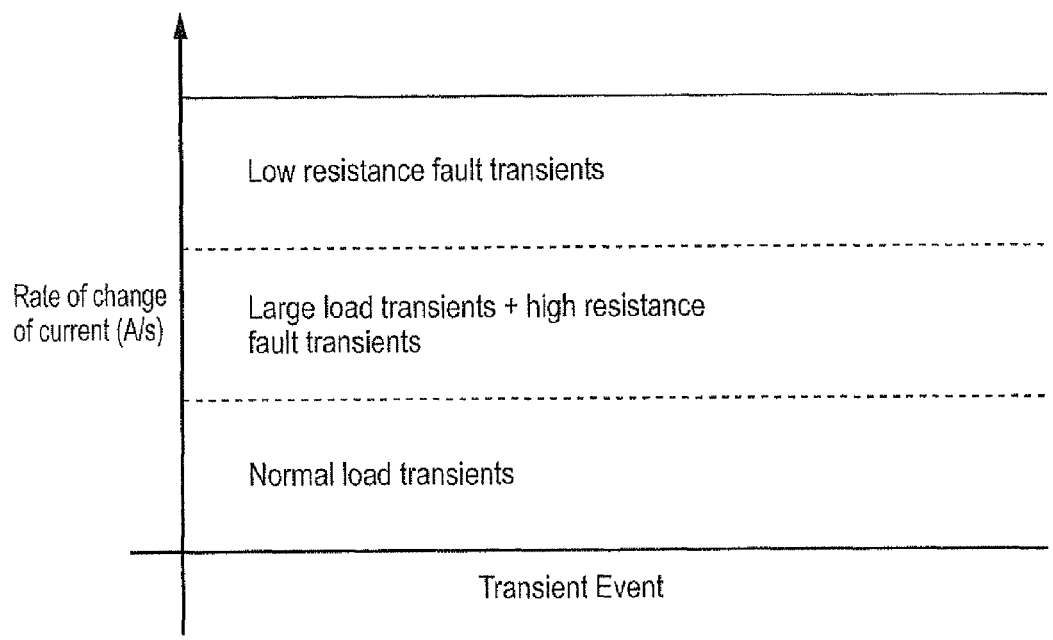
FIG. 2 shows levels of ROCR which a network may experience.
Figure 3:
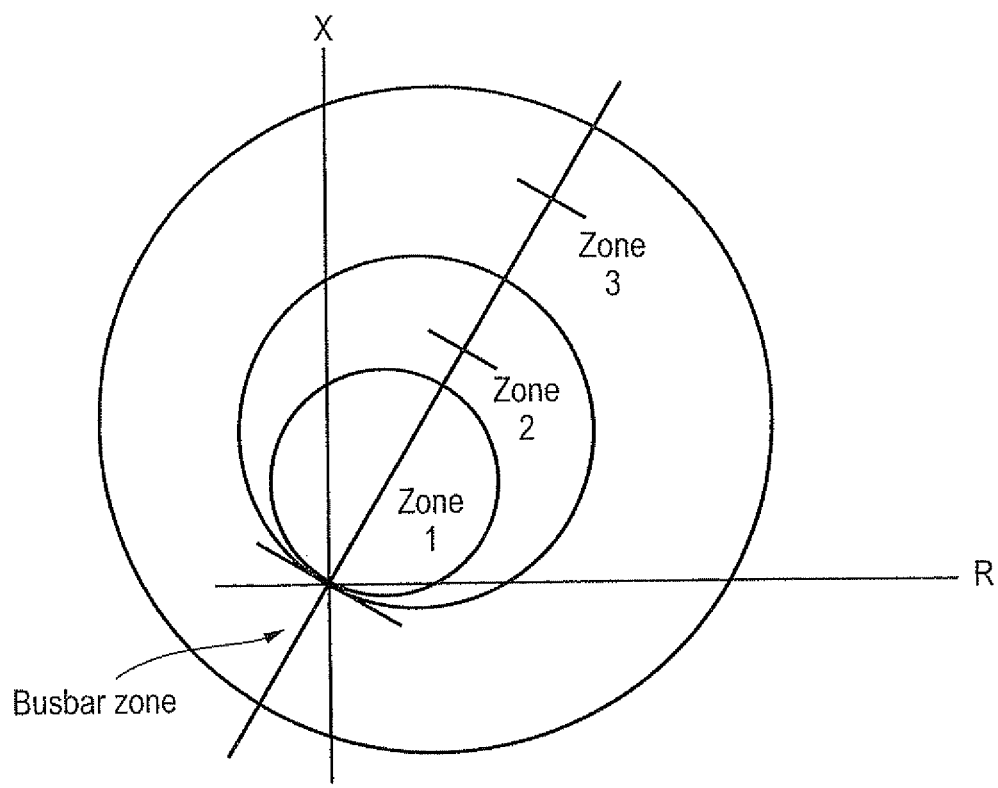
FIG. 3 shows the impedance characteristics of three overlapping zones of protection.
Figure 4:
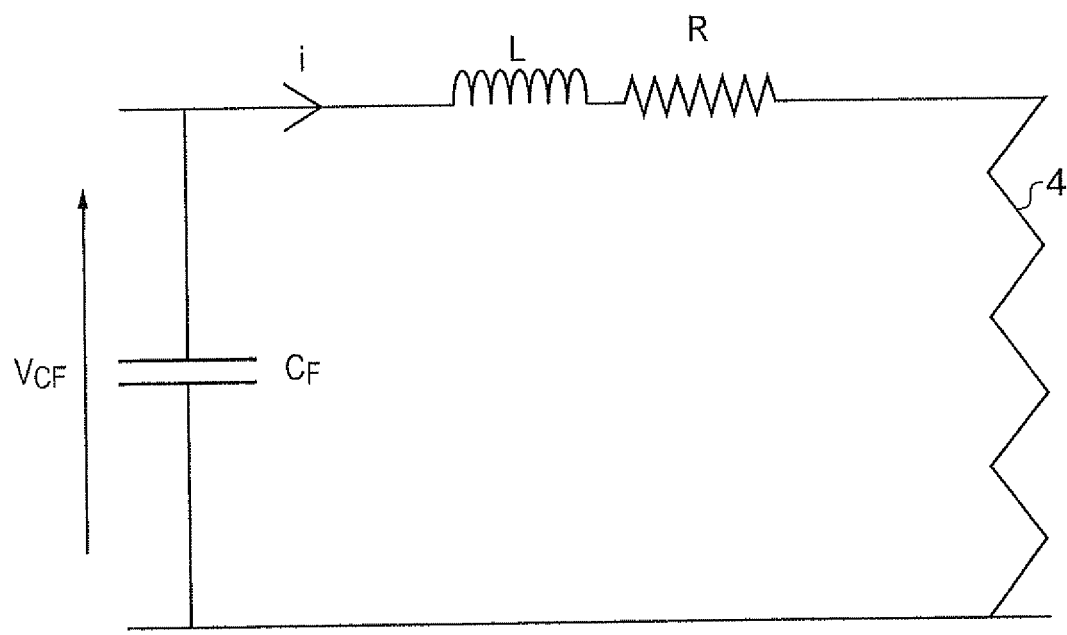
FIG. 4 shows an equivalent RLC circuit diagram for a section of a distribution network containing a fault.

More particularly, FIG. 4 shows an equivalent RLC circuit diagram for a section of the network containing a fault 4. When a switching event occurs (i.e. the fault), the voltage at the point of the fault initially decreases, creating a difference between the capacitor voltage $V_{C_F}$ and the fault voltage. To balance these voltages, the capacitor discharges current i.

Using the Laplace transform method, the current i can be expressed as:

$$i(s) = \frac{\frac{V_{C_F}(0)}{L} + s \cdot I_L(0)}{s^2 + \frac{R}{L}s + \frac{1}{L \cdot C_F}}$$

where $V_{C_F}(0)$ is the initial voltage across the capacitor, $I_L(0)$ is the initial current in the line, L is the inductance between the capacitor and fault, R is the resistance between the capacitor and the fault and $C_F$ is the capacitance of the capacitor. The derivative of this current is:

$$\frac{di}{ds} = I_L(0)\left[-\alpha \cdot \frac{s+\alpha}{s^2 + 2\cdot s\cdot\alpha + \alpha^2 + \omega_d^2} - \omega_d \cdot \frac{\omega_d}{s^2 + 2\cdot s\cdot\alpha + \alpha^2 + \omega_d^2}\right] +$$

$$\frac{\frac{V_{C_F}(0)-1}{2 \cdot I_L(0) \cdot R}}{L\omega_d}\left[-\alpha \cdot \frac{\omega_d}{s^2 + 2\cdot s\cdot\alpha + \alpha^2 + \omega_d^2} + \omega_d \cdot \frac{s+\alpha}{s^2 + 2\cdot s\cdot\alpha + \alpha^2 + \omega_d^2}\right]$$

where $\alpha$ is the damping factor (or Neper frequency) and is defined as:

$$\alpha = \frac{R}{2 \cdot L}$$

and the term $\omega_d$ is the resonant radian frequency and is defined as:

$$\omega_d = \frac{1}{\sqrt{L \cdot C_F}}.$$

Using initial value theorem (as t tends to zero, s tends to infinity) this results in:

$$x(t \to 0) = s \cdot X(s \to \infty)$$

$$s \cdot \frac{di(s \to \infty)}{ds} = -\alpha \cdot I_L(0) + \frac{V_{C_F}(0)}{L} - \alpha \cdot I_L(0)$$

$$\frac{di(s \to \infty)}{ds} \to \frac{V_{C_F}(0) - \cdot I_L(0) \cdot R}{L}$$

OR $$\frac{di(t \to 0)}{dt} \to \frac{V_{C_F}(0) - \cdot I_L(0) \cdot R}{L}$$

The equation for di/dt (as t approaches zero) shows that immediately after the switching event, the derivative current response will depend mainly on inductance, with the resistive contribution being dependent on initial (load) current where it creates an opposing voltage. If it is assumed that $I_L(0).R$ is negligible, then the measurement of di/dt and V(0) allow L to be determined. Rearranging the above equation for inductance (and ignoring the $I_L(0).R$ term) gives:

$$L = \frac{V_{C_F}(0)}{\frac{di(t \to 0)}{dt}}$$

Thus the inductance L of the section of the network containing the fault can be determined by measuring the voltage drop across the capacitor and the initial rate of change of current at the capacitor output, with the inductance being more accurately determined the closer the measurement is made to time zero. Then, with knowledge of the inductance per unit length (H/m) of the unfaulted line, the distance from the capacitor to the fault can be calculated. However, the rate at which the magnitude of di/dt decays from the time zero value is proportional to the damping factor, $\alpha$, and so the greater the fault resistance the quicker di/dt decays, making measurement more difficult.

The above analysis is valid for short circuit faults (which by definition have zero impedance) and purely resistive faults. However, for arc faults at least, studies show that voltage and current are in phase and so an assumption of purely resistive faults is valid.

In a similar manner to the measurement of impedance in distance protection, preferably the protection system of the present invention makes the inductance measurement with sufficient accuracy to place a fault in a certain protection zone. This can then help to inform the protection system of an appropriate response to the fault.

Figure 5:
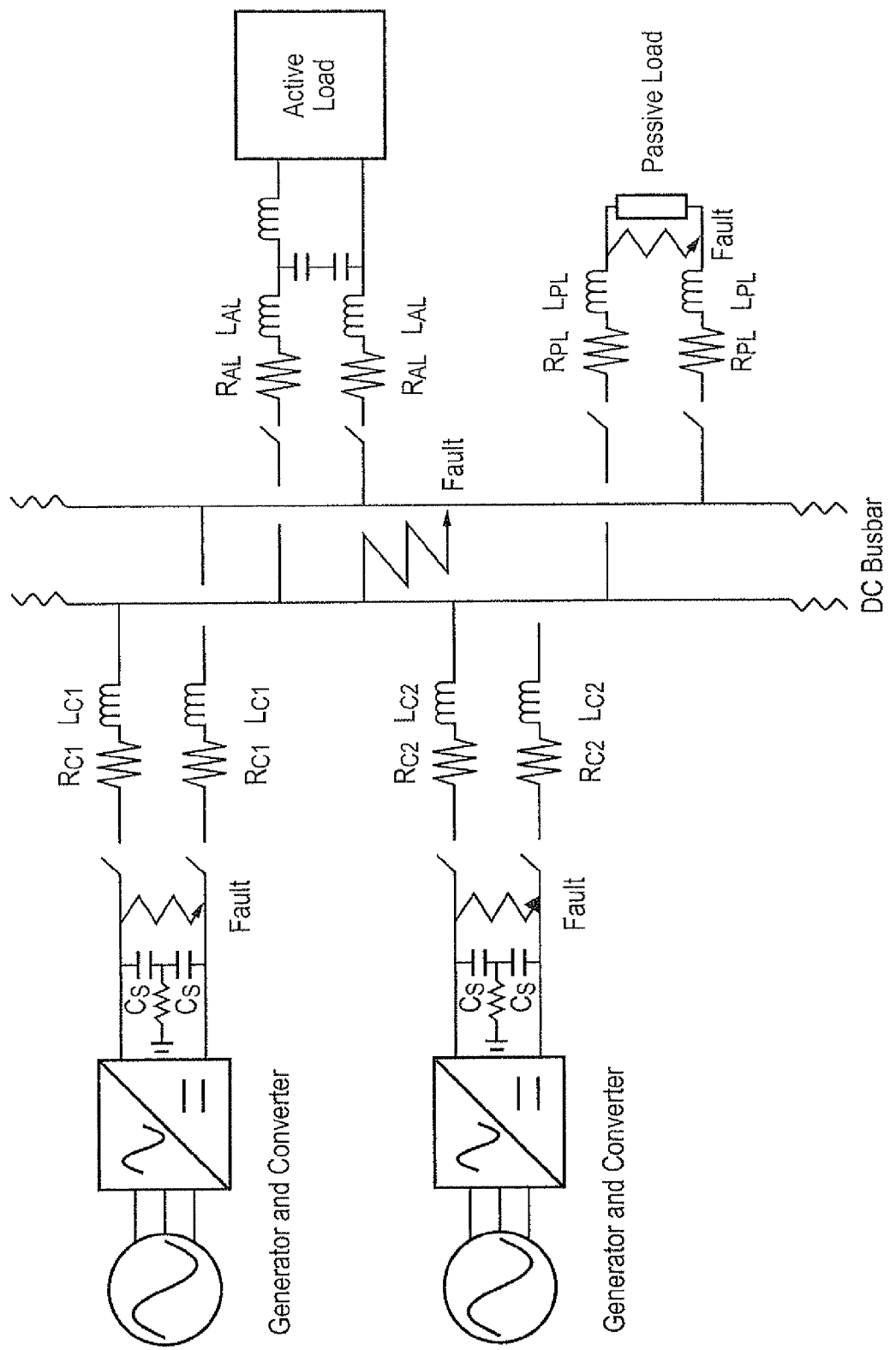
FIG. 5 shows a schematic diagram of a power network for an unmanned aerial vehicle.

As an example, FIG. 5 shows a schematic diagram of a power network for an unmanned aerial vehicle (UAV). Within the network there are two converter interfaced generators, one converter interfaced active load group (representative of avionics loads for example) and one passive load group (representative of wing de-icing systems for example). A busbar connects the parts of the network. The three converter interface parts of the network provide three potential measurement points from which to locate network faults. If a fault occurs on a branch of the network it should be isolated from the busbar while non-faulted branches should remain connected.

To achieve the desired discrimination for branch faults, the initial di/dt can be measured by a sensor on each of the converter output capacitors. Operating in isolation from each other, each sensor then sends a signal tripping circuit breakers for the respective branch if the measured initial di/dt exceeds a certain threshold. For example, for protection to operate for faults on a branch up to the busbar, the threshold would be exceeded when the measured inductance is less than the inductance of the conductor connecting the capacitor to the busbar, i.e. less than the inductance for that branch in the absence of a fault. The process of operation in this case would be:

1. Determine loop inductance up to the busbar ($L_{line}$)
2. Set relay to trip when $V_{C_F}/(di/dt) < L_{line}$
3. Continuously measure $V_{C_F}$ and di/dt and send trip signal to circuit breakers when threshold is exceeded.

As a backup, breakers beyond the protected branches could operate after a short time delay.

For faults beyond the protected branches, protection elsewhere in the network may be needed to isolate the faults. In the example network of FIG. 5, there is no means of isolating faults on the DC busbar, and these faults can only be cleared through the disconnection of all sources of fault current.

Advantageously, the use of inductance measurement for fault location rather than impedance facilitates faster detection of and thereby protection against faults. In particular, the inductance measurement only requires a few measurements for fault detection, unlike known derivative current schemes where current is measured over much longer periods.

However, there are further advantages of the present invention such as:

The detection of faults within a short time frame and prior to full capacitor discharge can prevent damage to network components and operation of internal fuse links. Protection coordination issues caused by capacitors discharging can also be avoided.

Improvement of coordination between network protection and converter internal protection, as fault detection can be performed prior to converter protection operation.

The operation of protection at lower current levels can reduce stress on the circuit breaking components, especially for DC networks where there is no zero crossing point. This can help improve long term component reliability. It can also reduce post fault transients, and potentially reduce breaker size requirements due to operation at lower fault levels.

Quicker fault isolation reduces the impact of faults on the rest of the network.

The voltage recovery time of the network can be improved if capacitors do not fully discharge their stored energy.

In the network of FIG. 5, the fault protection is distributed with autonomous decision-making elements (i.e. respective capacitor, sensor, and circuit breakers) for the protected branches. However, in an alternative system, a central control unit could combine inductance measurements from a plurality of positions in the network and then make a more informed decision about the correct protective action to take in the case of a fault.

For example, the centralised processing of a number of measurements could be used to locate a fault. In the network of FIG. 5 each inductance measurement can provide a respective approximate distance to the fault. However, if parallel paths exist between a capacitor and the fault (such as a busbar fault) then a single inductance measurement could be suggestive of a number of possible locations for the fault. Thus to allow the precise fault location to be derived, a number of inductance measurements can be compared. The location information can then be used to isolate the faulted area. For example, consider a case where a fault occurs at the passive load terminals, as illustrated in FIG. 5. An inductance measurement from either of the converter interfaces at the generators would be unable to accurately determine fault location, as a fault at the active load would present a very similar response (provided the inductance of the cables connecting is similar). However by also monitoring the active load capacitor output, measurements can be combined to determine that: first the fault does not exist on any of the branches where measurements are being taken, and second, the fault's distance from each of the measurement points and hence its approximate location.

Rather than using the output capacitance of converters for fault location, separate protection capacitors, used purely for fault detection and location, could be integrated into the network. These could consist of a single centralised capacitor or a number of small capacitors connected at key points in the network. The capacitors could be connected through a resistance to ensure fault level is not significantly increased. Use of such protection capacitors could provide protection for additional areas of a network e.g. non-converter interfaced loads.

Another option is to calculate the initial second current derivative from the current measurements. As the initial second current derivative is proportional to resistance, the calculation can provide an indication of fault resistance and hence help to identify the type of fault (e.g. as part of a post-fault diagnosis tool). Such information can be used to protect against or prevent the fault in the future.

The inductance measurement and associated circuit breaker(s) could be adopted as part of a converter's own protection. Converter protection and network protection may then respond to faults in a more coordinated way. This could help prevent the unnecessary and undesirable tripping of converters.

Although described above in relation to the power network of FIG. 5, the protection system may also have application in transmission and distribution networks (both AC and DC) where significant capacitance is present in the network, such as for filtering at the converter output of wind turbines, tidal or wave generators, or photovoltaic systems. Application could also be extended to network sections with reactive power compensation capacitors or high-voltage DC links. Monitoring of the initial derivative current can indicate fault path inductance, from which fault location can be derived. For AC systems, the frequency of any fault transient from the capacitive discharge is likely to be far higher than the system frequency and so the measured fault current derivative should be easily distinguishable from any current waveform. However, in AC systems there will be a variable voltage across the capacitance. As the magnitude of di/dt is proportional to this voltage, a fault occurring around a voltage zero will cause di/dt to be much reduced relative to peak levels. This may lead to difficulties detecting the fault from the inductance measurement.

Although the protection system typically performs best when applied to compact networks, it can also be applied to all converter interfaced systems with substantial output capacitance. Potential application areas include aerospace, marine, microgrid, space and power station DC auxiliary supply applications.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

The invention claimed is:

1. A protection system for a DC electrical power network, the system having:
   at least one convertor for connection of a power supply or load to the network, the convertor having an output capacitor;
   one or more circuit breaker arrangements which on activation isolate electrical faults within the network;
   one or more fault detectors including a sensor for measuring the voltage drop, $V_{CF}$, across the output capacitor and the rate of change of current, di/dt, at the output capacitor; and
   a fault type identification arrangement which receives from the fault detectors the measured rates of change of current, di/dt, determines therefrom second derivatives of current, d2i/dt2, across the capacitances, and identifies fault types from the second derivatives,
   wherein the or each fault detector measures an inductance of a respective section of the network, the system being configured to activate one or more of the circuit breaker arrangements in response to measured inductances which are indicative of a fault, and
   the inductance of the respective section is determined from $V_{CF}/(di/dt)$.

2. A protection system for an electrical power network according to claim 1, wherein the or each fault detector measures the inductance of a respective section of the network containing a corresponding circuit breaker arrangement, which circuit breaker arrangement is configured to activate when the measured inductance falls beneath a predetermined inductance which is indicative of a fault in the section.

3. A protection system according to claim 2, wherein the predetermined inductance for the section is the inductance for that section in the absence of a fault.

4. A protection system for an electrical power distribution network according to claim 1, the system having:
   a plurality of the circuit breaker arrangements,
   a plurality of the fault detectors, and
   a control unit which operatively connects the fault detectors to the circuit breaker arrangements;
   wherein:
   the fault detectors measure the inductances of respective sections of the network, and
   the control unit is configured to receive the measured inductances from the fault detectors, to determine therefrom the likely location of an electrical fault, and to send an activation signal to one or more of the circuit breaker arrangements to isolate the fault.

5. An electrical power network having the protection system according to claim 1.

6. An electrical power network according to claim 5, wherein the or each respective section of the network interfaces to a corresponding power electronic converter for connection of a power supply or load to the network, the respective fault detector for the section measuring the inductance from a position at the interface of the converter with the section.

7. A method of protecting a DC electrical power network, the method including the steps of:
   providing at least one convertor for connection of a power supply or load to the network, the convertor having an output capacitor;
   providing one or more circuit breaker arrangements which on activation isolate electrical faults within the network;
   measuring inductances by measuring the voltage drop, $V_{CF}$, across the output capacitor and the rate of change of current, di/dt, at the output capacitor of one or more respective sections of the network;
   determining from measured rates of change of current, di/dt, second deriatives of current, d2i/dt2, at the capacitance outputs;
   identifying fault types from the second derivatives; and
   activating one or more of the circuit breaker arrangements in response to measured inductances which are indicative of a fault, wherein
   in the measuring step, the inductance is determined from $V_{CF}/(di/dt)$.

8. A method according to claim 7, wherein:
   in the measuring step, the or each respective section of the network contains a corresponding circuit breaker arrangement, and
   in the activating step, a corresponding circuit breaker arrangement is activated when the measured inductance for the respective section falls beneath a predetermined inductance which is indicative of a fault in the section.

9. A method according to claim 8, wherein the predetermined inductance for the section is the inductance for that section in the absence of a fault.

* * * * *